United States Patent
Chan et al.

(10) Patent No.: US 9,553,107 B2
(45) Date of Patent: Jan. 24, 2017

(54) SHALLOW EXTENSION JUNCTION

(71) Applicant: International Business Machines Corporation, Armonk, NY (US)

(72) Inventors: Kevin K. Chan, Staten Island, NY (US); Pouya Hashemi, White Plains, NY (US); Effendi Leobandung, Stormville, NY (US); Dae-Gyu Park, Poughquag, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/995,218

(22) Filed: Jan. 14, 2016

(65) Prior Publication Data

US 2016/0172381 A1  Jun. 16, 2016

Related U.S. Application Data (63) Continuation of application No. 14/568,147, filed on Dec. 12, 2014, now Pat. No. 9,306,038.

(51) Int. Cl.
| | |
|---|---|
| H01L 27/12 | (2006.01) |
| H01L 29/66 | (2006.01) |
| H01L 29/78 | (2006.01) |
| H01L 29/06 | (2006.01) |
| H01L 29/16 | (2006.01) |
| H01L 29/423 | (2006.01) |
| H01L 29/49 | (2006.01) |

(52) U.S. Cl.
CPC ....... *H01L 27/1211* (2013.01); *H01L 29/0653* (2013.01); *H01L 29/16* (2013.01); *H01L 29/42356* (2013.01); *H01L 29/49* (2013.01); *H01L 29/66795* (2013.01); *H01L 29/785* (2013.01)

(58) Field of Classification Search
CPC .................................................. H01L 27/1211
USPC ......................................................... 257/347
See application file for complete search history.

(56) References Cited

U.S. PATENT DOCUMENTS

| | | | |
|---|---|---|---|
| 6,905,976 B2 | 6/2005 | Beintner et al. | |
| 7,045,401 B2 | 5/2006 | Lee et al. | |
| 7,316,960 B2 | 1/2008 | Ting | |

(Continued)

OTHER PUBLICATIONS

IBM Appendix P, list of patents and patent applications treated as related, Jan. 14, 2016, 2 pages.

(Continued)

*Primary Examiner* — Anthony Ho
(74) *Attorney, Agent, or Firm* — Steven F. McDaniel (57) ABSTRACT

A method for fabricating a semiconductor device includes receiving a finned substrate comprising an isolation layer with a plurality of semiconductor fins formed thereon, forming a gate structure over a fin that comprises a gate and a seed layer disposed below the gate and immediately adjacent to the fin, and epitaxially growing a gate extender from the seed layer that laterally extends over a source or drain region of the fin. In one embodiment, a semiconductor device includes a finned substrate comprising an isolation layer with a plurality of semiconductor fins formed thereon, a gate structure formed over a fin of the plurality of fins, the gate structure comprising a gate and a seed layer disposed below the gate and immediately adjacent to the fin, and a gate extender epitaxially grown from the seed layer that laterally extends over a source or drain region of the fin.

8 Claims, 6 Drawing Sheets

(56) References Cited

U.S. PATENT DOCUMENTS

| | | |
|---|---|---|
| 7,456,087 B2 | 11/2008 | Cheng |
| 7,683,405 B2 | 3/2010 | Son et al. |
| 7,736,982 B2 | 6/2010 | Liao et al. |
| 8,298,925 B2 | 10/2012 | Wu et al. |
| 8,338,259 B2 | 12/2012 | Wu et al. |
| 8,563,384 B2 | 10/2013 | Ranade et al. |

OTHER PUBLICATIONS

Mizushima, I., "Selective Epitaxy of Si and SiGe for Future MOS Devices", ECS Transactions, 22 (1) 81-90 (2009), 10.1149/1.3152964 © The Electrochemical Society.

Ranade, et al., "Application of Silicon-Germanium in the Fabrication of Ultra-shallow Extension Junctions for Sub-100 nm PMOSEFETs", IEEE Transactions on Electron Devices, vol. 49, No. 8, Aug. 2002, pp. 1436-1443, © 2002 IEEE.

Chan et al., "Shallow Extension Junction", U.S. Appl. No. 14/568,147, filed Dec. 12, 2014, pp. 1-22.

SHALLOW EXTENSION JUNCTION

BACKGROUND OF THE INVENTION

The present invention relates generally to semiconductor devices and device fabrication and more particularly to non-planar semiconductor devices and device fabrication.

One of the challenges in scaling transistors to increasingly smaller geometries is controlling leakage current while increasing drive current. Fully depleted devices such as ETSOI, tri-gate, and finfet devices offer the promise of excellent control of short channel effects (e.g., barrier lowering, punch-through, surface scattering, velocity saturation, impact ionization, and hot electrons). However, fully depleted devices suffer from high extension resistance that degrades device performance.

One of the factors in high extension resistance is traditional ion implantation that is used to dope selected regions of semiconductor devices. The bombardment of ions during traditional ion implantation destroys much of the crystalline structure resulting in many non-crystalline (amorphous) regions. Unlike planar structures, which do not have surface discontinuities, the discontinuities of non-planar devices impede re-crystallization from intact crystalline regions (also known as seeds) during high temperature annealing. As a result, non-planar devices have higher resistivity than planar devices. Furthermore, traditional ion implantation leaves the extension region of a device (e.g., the area below the lateral spacers of the gate) undoped, resulting in even higher device resistance.

SUMMARY

A semiconductor device (i.e., apparatus) and a method for fabricating the semiconductor device are disclosed herein. In one embodiment, the method includes receiving a finned substrate comprising an isolation layer with a plurality of fins formed thereon, the plurality of fins comprising a semiconductor material, forming a gate structure over a fin of the plurality of fins, the gate structure comprising a gate and a seed layer disposed below the gate and immediately adjacent to the fin, and epitaxially growing a gate extender from the seed layer that laterally extends over a source or drain region of the fin. Epitaxially growing the gate extender may include in-situ doping of the gate extender. The method may also include conducting a low temperature diffusion process to diffuse a dopant within the gate extender to the source or drain region of the fin.

In one embodiment, the semiconductor device includes a finned substrate comprising an isolation layer with a plurality of fins formed thereon, the plurality of fins comprising a semiconductor material, a gate structure formed over a fin of the plurality of fins, the gate structure comprising a gate and a seed layer disposed below the gate and immediately adjacent to the fin, and a gate extender epitaxially grown from the seed layer that laterally extends over a source or drain region of the fin. The gate extender may overlap the gate and a channel portion of the fin that is disposed below the gate. In some embodiments, the gate structure is formed by etching the seed layer below a lateral spacer of the gate structure to form a cavity between the lateral spacer and the fin. The cavity formed between the lateral spacer and the fin may extend beyond a lateral edge of the gate and overlap the gate. The cavity may be at least partially filled by epitaxially growing the gate extender. In some embodiments, the plurality of fins comprise silicon (and no germanium) and the seed layer and the gate extender comprise at least 50 percent germanium.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

DETAILED DESCRIPTION

The embodiments disclosed herein eliminate the need for high temperature annealing, enable doping of the extension regions of semiconductor devices, and reduce device resistance.

Figure 1:
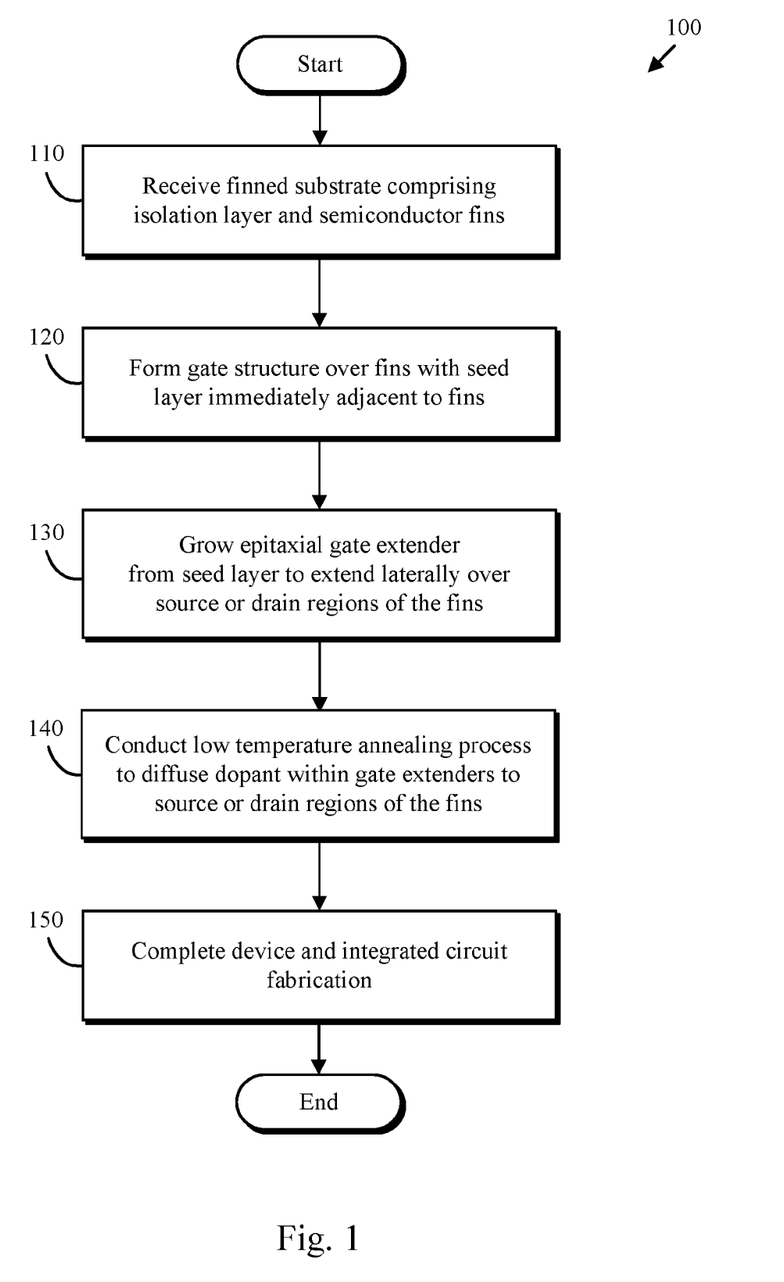
FIG. 1 is a flowchart depicting one embodiment of a method for fabricating a semiconductor device.

For example, FIG. 1 is a flowchart depicting one embodiment of a method 100 for fabricating a semiconductor device. As depicted, the method includes receiving (110) a finned substrate, forming (120) a gate structure with a seed layer, growing (130) an epitaxial gate extender from the seed layer, conducting (140) a low temperature annealing process, and completing (150) device and integrated circuit fabrication. The method 100 may be used to fabricate semiconductor devices with reduced channel resistance.

Receiving (110) a finned substrate may include receiving a substrate with an isolation layer and semiconductor fins formed on the surface. The substrate may be a semiconductor-on-insulator (SOI) substrate where the semiconductor layer is patterned with fins.

Forming (120) a gate structure may include depositing and patterning a gate and associated elements such as lateral spacers. The gate structure may be formed over one or more fins that have a seed layer deposited thereon (immediately adjacent to the fins). The gate structure may cover a top, a left sidewall and a right sidewall of one or more fins. In conjunction with forming the gate structure, the seed layer may be etched to form a cavity that extends beyond a lateral edge of the actual gate of the gate structure and thereby partially overlaps with the gate (see FIG. 6C).

Growing (130) an epitaxial gate extender may include epitaxially growing the seed layer to extend laterally over the source and/or drain regions of the fins. The gate extenders formed by epitaxial growth may be in-situ doped to lower the resistance of the extension and provide an electrically conductive bridge between the gate and the source or drain regions. Each gate extender may overlap with a gate and provide a bridge between the gate and a source or drain region of a fin.

The gate extenders to the source or drain regions may be provided with a dopant (via in-situ doping) corresponding to the semiconductor type of the source or drain region that is below the gate extender. For example, a boron dopant may be provided for p-type source/drain regions and a phosphorus or arsenic dopant may be provided for n-type source/drain regions. Other possible dopants include tin, antimony, and aluminum. Combinations of dopants may also be used.

Conducting (140) a low temperature annealing process may include annealing the substrate to enable diffusion of the dopant within the gate extenders into the source/drain regions of the fins. Diffusion of the dopant (across the interface) into the source/drain regions of the fins may lower the resistance of the resulting semiconductor devices.

Completing (150) device and integrated circuit fabrication may include conducting additional fabrication steps to create a complete integrated circuit including packaging of the integrated circuit.

Figure 2:
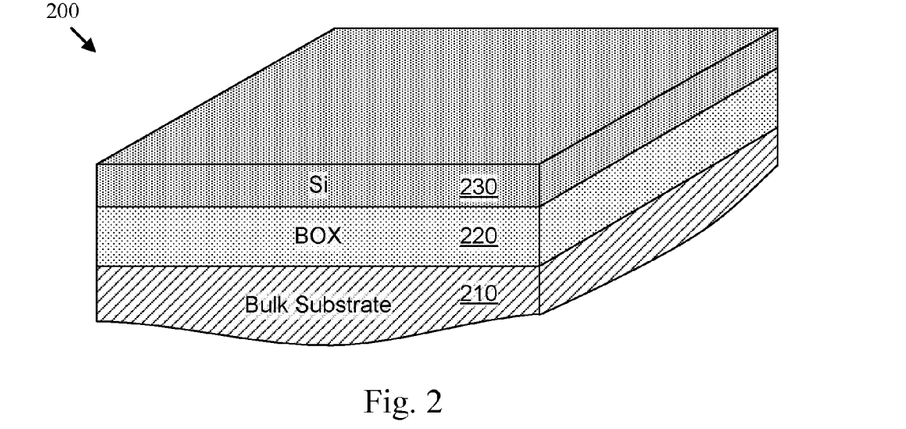
FIG. 2 is a perspective view illustration of a semiconductor-on-insulator (SOI) substrate.

FIG. 2 is a perspective view illustration of a semiconductor-on-insulator (SOI) substrate 200. As depicted, the SOI substrate 200 includes a bulk substrate layer 210, an insulating layer 220, and a semiconductor layer 230. In the embodiment depicted in FIG. 2, and in embodiments shown in subsequent figures, the semiconductor layer 230 is silicon. The SOI substrate 200 may be commercially available, or may be fabricated through processes known to those skilled in the art. For example, the SOI substrate 200 may be fabricated by processing bulk silicon wafers using the SIMOX process, or the like. In one embodiment, an oxygen ion beam is used to implant oxygen molecules into the bulk substrate which is subsequently annealed to form an insulating layer 220 of silicon dioxide that is sandwiched between the silicon bulk substrate layer 210 and a silicon semiconductor layer 230.

FIGS. 3 through 7 are perspective view, front view, and side view illustrations of the SOI substrate at various stages of processing for one embodiment of the method of FIG. 1. With each illustration, the Figure number (i.e., 3 through 7) is appended with the letter A, B, or C for the perspective view, front view, and side views of the SOI substrate, respectively. For simplicity, the bulk substrate layer 210 of the SOI substrate 200 is omitted from FIGS. 3 through 7.

Figure 3A:
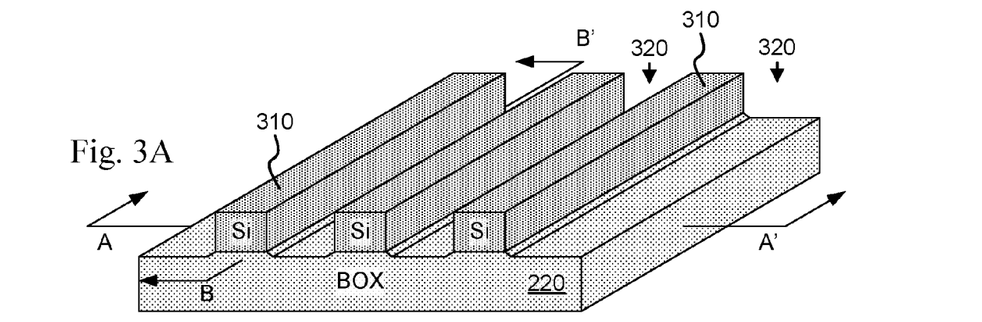
FIGS. 3A, 3B, and 3C are perspective view, front view and side view illustrations of the SOI substrate at a particular stage of processing for one embodiment of the method of FIG. 1.
Figure 3B:
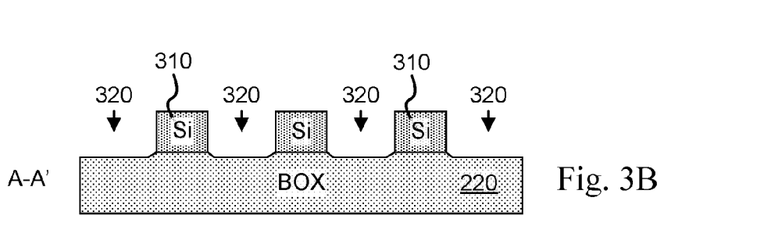
Figure 3C:
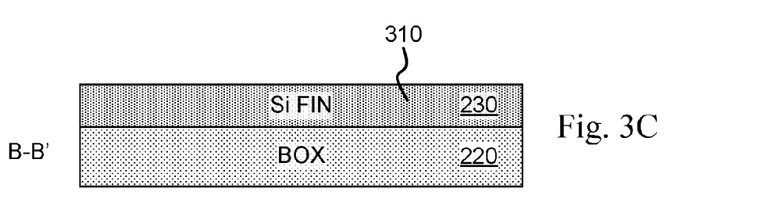

FIGS. 3A-3C show that semiconductor fins 310 may be formed on the SOI substrate 200. For example, a reactive ion (directional) etch process may be used to etch trenches 320 that form (i.e., define) the semiconductor fins 310 from the semiconductor layer 230. Consequently, the semiconductor fins 310 may comprise the same material as the semiconductor layer 230. In the depicted embodiments, the semiconductor fins 310 comprise silicon.

Figure 4A:
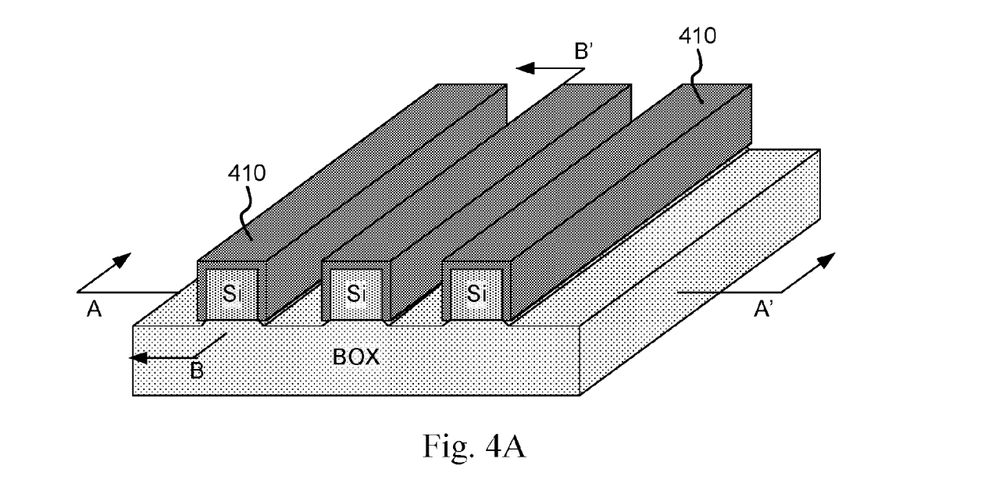
FIGS. 4A, 4B, and 4C are perspective view, front view and side view illustrations of the SOI substrate at a particular stage of processing for one embodiment of the method of FIG. 1.
Figure 4B:
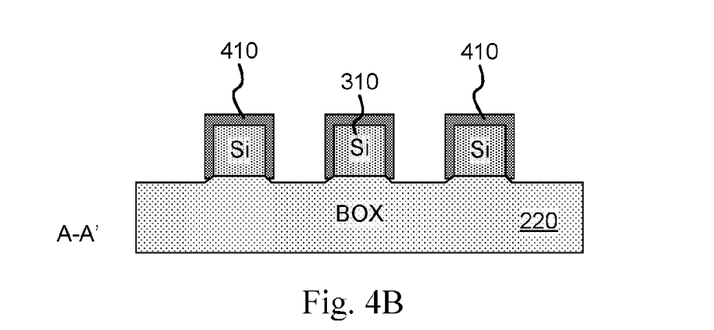
Figure 4C:
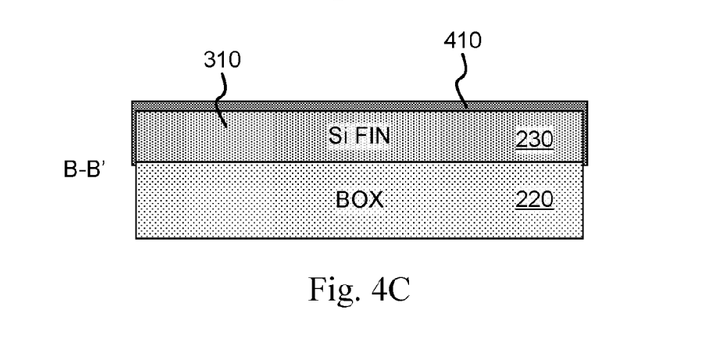

FIGS. 4A-4C show that an epitaxial seed layer 410 may be deposited on the semiconductor fins 310. For example, chemical vapor deposition may be used to deposit a (seed) material on the semiconductor fins 310. The epitaxial seed layer may have a thickness that is sufficiently thin to degrade the voltage threshold of the device. For example, in some embodiments, the thickness of the epitaxial seed layer is less than 20 nm.

The material used to form the epitaxial seed layer 410 may adhere to the exposed portions of the semiconductor fins 310 and not to the insulating layer 220. In some embodiments, germanium or a silicon-germanium alloy (with equal or greater amounts of germanium than silicon) is deposited on the semiconductor fins 310 via chemical vapor deposition.

Figure 5A:
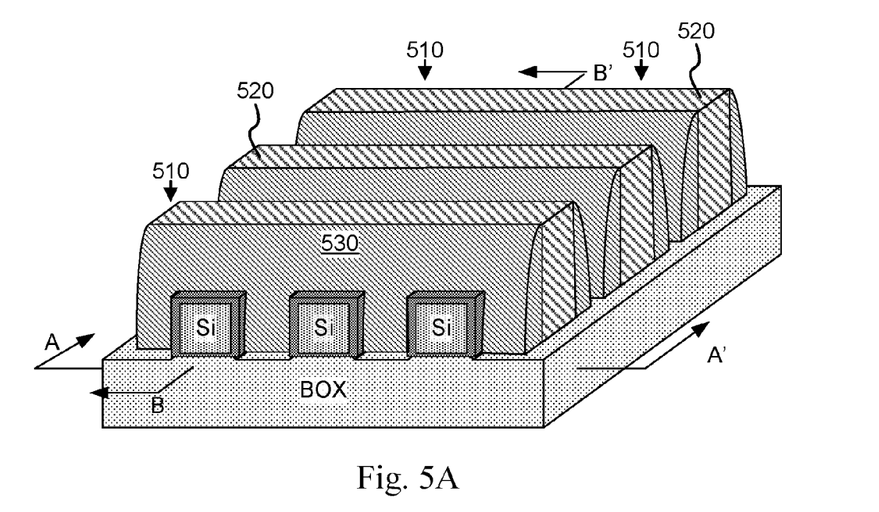
FIGS. 5A, 5B, and 5C are perspective view, front view and side view illustrations of the SOI substrate at a particular stage of processing for one embodiment of the method of FIG. 1.
Figure 5B:
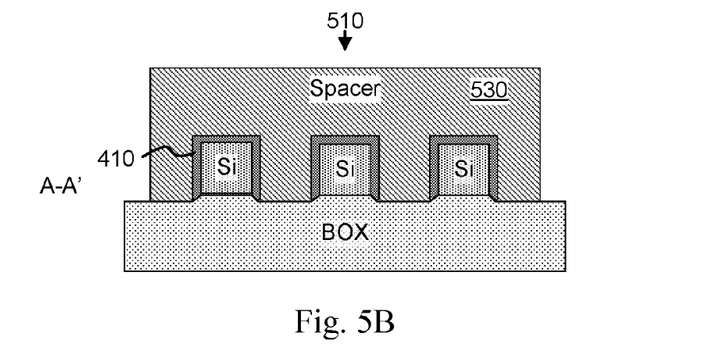
Figure 5C:
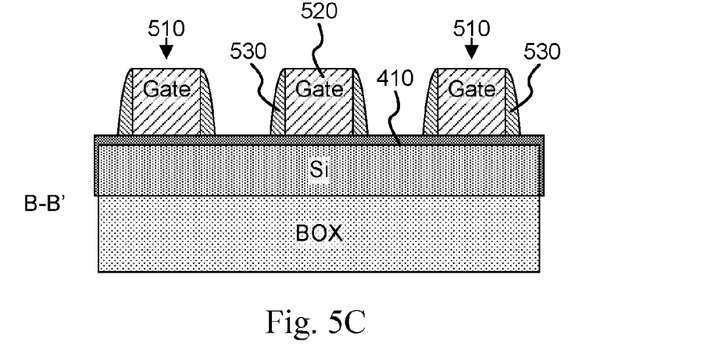

FIGS. 5A-5C show that a gate structure 510 may be formed over the semiconductor fins 310 and the epitaxial seed layer 410. The depicted gate structure 510 includes a gate 520 and lateral spacers 530. The gate structure 510 may be fabricated according to methods known by those skilled in the art. For example, the gate 520 may be fabricated by depositing and patterning one or more gate materials. In certain embodiments, polysilicon and a metal (e.g., a high-k metal) are deposited (i.e., layered) and patterned to form one or more gates 520. In some embodiments, sidewall image transfer process is used to form the lateral spacer 530 on the sidewalls of the gate 520. The material used to form the lateral spacer 530 may be an oxide such as silicon dioxide or nitride such as silicon nitride.

Figure 6A:
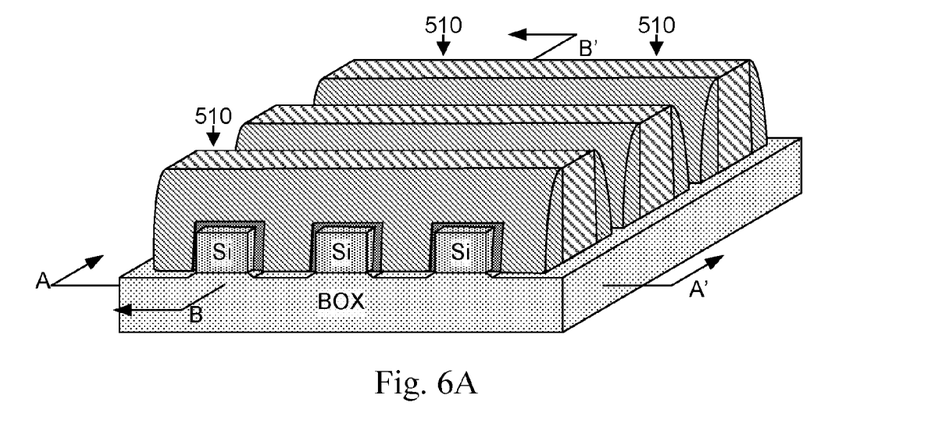
FIGS. 6A, 6B, and 6C are perspective view, front view and side view illustrations of the SOI substrate at a particular stage of processing for one embodiment of the method of FIG. 1.
Figure 6B:
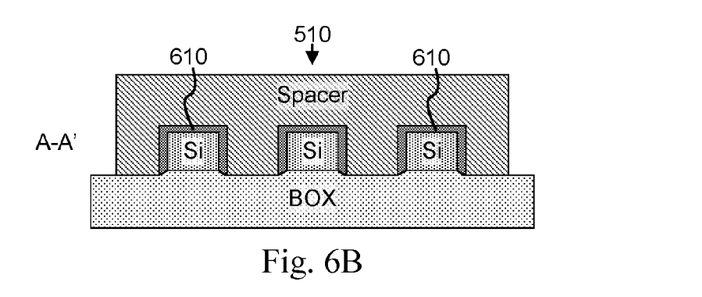
Figure 6C:
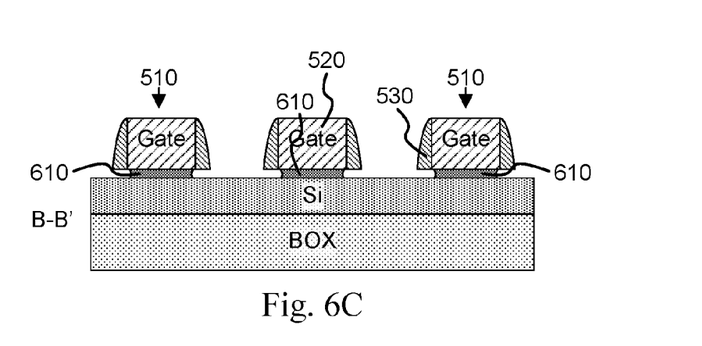

FIGS. 6A-6C show that an epitaxial seed layer 410 may be wet etched (e.g., with $H_2O_2$ or other wet etchants) to expose the portion of the semiconductor fins that is not directly below the gate 520 and form a cavity below the lateral spacer 530. In some embodiments, the epitaxial seed layer 410 is etched beyond the border of the gate 520 to ensure that the cavity extends below the gate 520 (and the gate 520 extends beyond a remaining portion 610 of the epitaxial seed layer). The duration of the etching process may be adjusted to achieve the desired undercut of the gate 520.

Figure 7A:
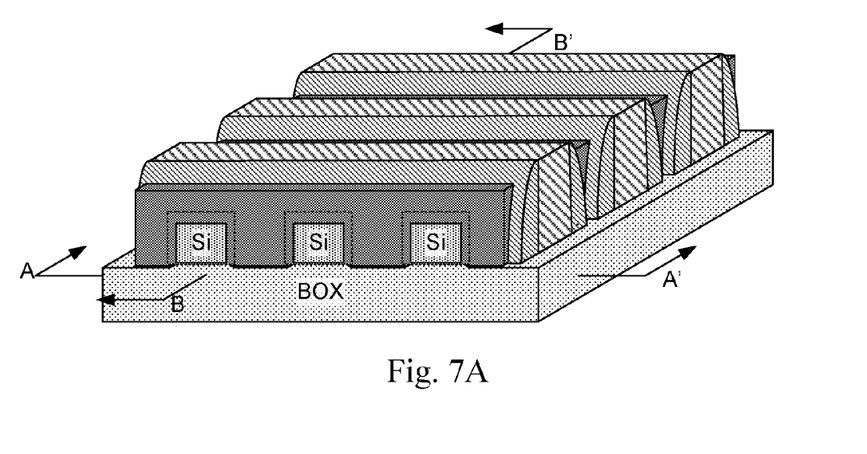
FIGS. 7A, 7B, and 7C are perspective view, front view and side view illustrations of the SOI substrate at a particular stage of processing for one embodiment of the method of FIG. 1.
Figure 7B:
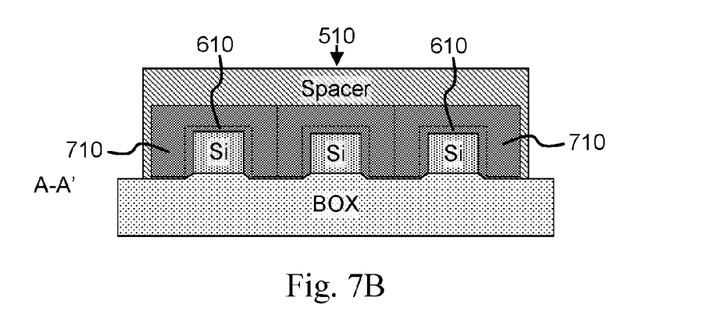
Figure 7C:
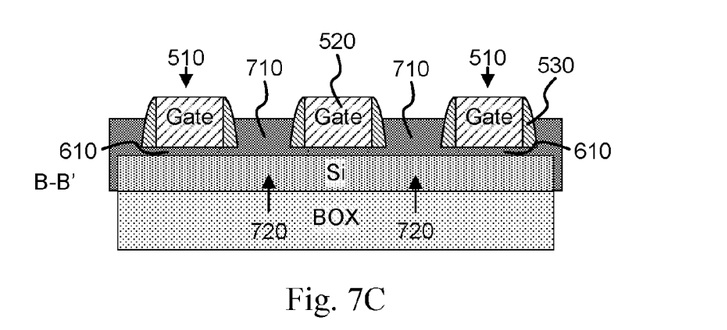

FIGS. 7A-7C show that the remaining portion of the epitaxial seed layer 610 may be used as a seed for epitaxial growth to form a gate extender 710. As shown in FIG. 7C, each gate extender 710 may extend laterally from the remaining portion 610 of the epitaxial seed layer to a source or drain region 720 of the fins. To provide good electrical conductivity, the gate extender, which is doped, may overlap the gate 520 and a channel portion of the fin (not shown) that is disposed below the gate.

During epitaxial growth of the gate extender, in-situ doping may be used to lower the resistance of the extension and provide an electrically conductive bridge between the gate and the source or drain region(s) 720 which the gate extender 710 covers. P-type extenders for p-type source and drain regions and n-type extenders for n-type source and drain regions may be epitaxially grown during separate phases of fabrication. For example, n-type epitaxial growth may be conducted while the p-type regions are masked off, and n-type epitaxial growth may be conducted while the p-type regions are masked off.

Subsequent to the above, the substrate 200 and the devices formed thereon may undergo low temperature annealing (e.g., 600 degrees Celsius) to diffuse the dopant into the source or drain regions and provide better electrical connectivity and eliminate undoped extension regions.

In addition to the steps and operations disclosed herein, additional steps and operations may be performed while retaining the spirit and intent of the disclosed embodiments. Also, it should be noted that the apparatuses disclosed herein may be integrated with additional circuitry within integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A semiconductor device comprising:
a finned substrate comprising an isolation layer with a plurality of fins formed thereon, the plurality of fins comprising a semiconductor material;
a gate structure formed over a fin of the plurality of fins, the gate structure comprising a gate and a seed layer disposed below the gate and immediately adjacent to the fin; and
a gate extender epitaxially grown from the seed layer that laterally extends over a source or drain region of the fin.

2. The semiconductor device of claim 1, wherein the gate extender overlaps the gate and a channel portion of the fin that is disposed below the gate.

3. The semiconductor device of claim 1, wherein the gate extender was in-situ doped while the gate extender was epitaxially grown.

4. The semiconductor device of claim 1, wherein the gate structure was formed by etching the seed layer below a lateral spacer of the gate structure to form a cavity between the lateral spacer and the fin.

5. The semiconductor device of claim 4, wherein the cavity formed between the lateral spacer and the fin extended beyond a lateral edge of the gate and overlapped the gate.

6. The semiconductor device of claim 4, wherein the cavity formed between the lateral spacer and the fin was at least partially filled by epitaxially growing the gate extender.

7. The semiconductor device of claim 1, wherein the plurality of fins comprise Si and no Ge.

8. The semiconductor device of claim 1, wherein the seed layer and the gate extender comprise Ge.

* * * * *